United States Patent

Nakanuma et al.

[15] 3,688,389

[45] Sept. 5, 1972

[54] INSULATED GATE TYPE FIELD EFFECT SEMICONDUCTOR DEVICE HAVING NARROW CHANNEL AND METHOD OF FABRICATING SAME

[72] Inventors: Sho Nakanuma; Tohru Tsujide; Toshio Wada, all of Tokyo, Japan

[73] Assignee: Nippon Electric Company, Limited, Tokyo, Japan

[22] Filed: Feb. 19, 1970

[21] Appl. No.: 12,731

[30] Foreign Application Priority Data

Feb. 20, 1969 Japan ......................44/12967

[52] U.S. Cl. ....................29/571, 29/584, 250/49.5 T

[51] Int. Cl. ..........................B01j 17/00, H01g 13/00

[58] Field of Search ............29/576 B, 571, 584, 585; 148/1.5; 317/235; 250/49.5 TE, 49.5 R

[56] References Cited

UNITED STATES PATENTS

| | | | |
|---|---|---|---|
| 3,328,210 | 6/1967 | McCaldin et al. | 29/584 X |
| 3,448,353 | 6/1969 | Gallagher et al. | 317/235 |
| 3,458,368 | 7/1969 | Haberecht | 317/235 |
| 3,540,925 | 11/1970 | Athanas et al. | 148/1.5 |
| 3,570,112 | 3/1971 | Barry et al. | 29/571 |

*Primary Examiner*—John F. Campbell
*Assistant Examiner*—W. Tupman
*Attorney*—Sandoe, Hopgood and Calimafde

[57] ABSTRACT

A method for fabricating an integrated gate field effect transistor is disclosed wherein an induced conduction region is formed between the source and drain regions by the application of a suitable potential between the gate electrode and substrate. The surface of the device is irradiated by a high-energy beam, thereby to form a narrow channel in the conduction region which defines the gate channel of the field effect transistor.

11 Claims, 7 Drawing Figures

*INVENTORS*
TORU TSUJIDE
SHO NAKANUMA
TOSHIO WADA

*by*

*Sandoe, Hopgood & Calimafde*
ATTORNEYS

INVENTORS
TORU TSUJIDE
SHO NAKANUMA
TOSHIO WADA
by
Sandoe, Hopgood & Calimafde
ATTORNEYS

INSULATED GATE TYPE FIELD EFFECT SEMICONDUCTOR DEVICE HAVING NARROW CHANNEL AND METHOD OF FABRICATING SAME

This invention relates to an insulated gate type field effect semiconductor device having a metal-insulating film-semiconductor structure therein (hereinafter referred to as an MIS structure), and, more particularly, to an insulated gate type field effect transistor having excellent electric performance characteristics and high reliability.

Generally, semiconductor devices having the MIS structure, such as an insulated gate type field effect transistor (IGFET) and an integrated circuit, have disadvantages in that their high speed operation performance is slower than that of a bipolar type transistor.

In the MIS type semiconductor device the delay time *td* in signal propagation is proportional to the square of the channel length L between the source and the drain, and is inversely proportional to the mobility of the carrier flowing through the channel. In order to improve the electric performance of the MIS type semiconductor device, in the high speed operation, it is therefore necessary to obtain a device of this type having the shortest possible length between the source and the drain.

Practically, the IGFET has a drain and a source regions of one conductivity separately formed in a host semiconductor substrate of opposite conductivity by the use of photolithographic and etching techniques and a following diffusion process. However, because of limitations in the known manufacturing processes for these devices the reduction of the channel length is limited to 4 microns at the minimum even when the process is carried out with the use of the most advanced machine facilities.

The mutual conductance $g_m$ of an IGFET is inversely proportional to the channel length L and is proportional to the width of channel W, the mobility and the dielectric constant $\mu$ of the insulating film. Therefore it is necessary to provide the IGFET with a shorter channel length in order to obtain a high mutual conductance. Also, it is general practice to employ a silicon dioxide film as the gate insulator film, but this film has a dielectric constant of 1.6 and, therefore, there is a need for an insulating film having a higher dielectric constant in order to realize a higher mutual conductance.

As mentioned above, the difficulty in decreasing the channel length between the source and the drain regions in the conventional IGFET mitigates against the improvement of high speed performance and provision of a higher mutual conductance for such devices, and prevents improvement of the integrity, reliability and high yield of production of integrated circuits.

An object of this invention is to provide an insulated gate type field effect semiconductor device having an increased value of mutual conductance and an excellent high speed performance.

This invention is based on newly found knowledge that a MIS structure having a certain kind of insulator material, (for example, alumina fabricated through a vapor growth process at high temperatures) exhibits the characteristic that its capacitance vs. voltage curves may be shifted toward the positive direction by applying a gate voltage not lower than a critical value independent of the polarity, and types, e.g. DC, AC, or pulse of the gate voltage. The shifted capacitance-voltage characteristic is very stable, is not returned by electric treatment, and is resettable by radiation such as with X-rays and electron beams without any damage. This phenomenon appears to result from the insulator material of the MIS structure having new trapping centers which are capable of capturing electrons semi-permanently injected by the application of the gate voltage across both surfaces of the insulator film exceeding the critical value. The shifted and the initial capacitance-voltage characteristics are not changed under the normal operation of the MIS device since the normal gate voltage is less than the critical value.

An IGFET which comprises an insulator film having the permanent trapping center is formed over the surface of a semiconductor substrate between the drain and source regions formed in the semiconductor substrate and the gate electrode is attached over the insulator film. By the application of a DC or AC voltage exceeding the critical value to the gate electrode, the insulator film is capable of capturing electrons into the trapping centers therein. In the case of P-channel type IGFET formed on the surface of the semiconductor substrate, a highly conductive inversion layer is induced by the application of the gate voltage above the critical value and, then, beams of high energy rays, such as an electron beam, X-rays, ultraviolet rays or the like, which are concentrated to an extremely small area, are swept over the electrode across the inversion layer between the source and drain regions. This treatment excites the electrons captured in the permanent trapping center and causes the electrons to escape from the trapping center. The electrode is irradiated by the beams until the insulating film is partially restored to its original condition by the beam. The partially restored portion of the insulator film forms a band-like channel region thereunder, which is disposed across the inversion layer.

The IGFET according to this invention has the channel length between the source and the drain regions determined by the diameter of the irradiated beams. Since beams of the nature described may be readily converged, it thus becomes possible to fabricate a semiconductor device having a remarkably short channel measuring 1$\mu$ or less with excellent accuracy and at a high yield through the use of a beam having a small elevation angle obtained from a conventional high-energy beam generating machine. The electrical characteristics of the semiconductor device have remarkably improved characteristics as compared to those of field effect semiconductors formed by conventional photolithographic and etching techniques and selective diffusion process. Accordingly, it is possible for the IGFET of the invention to have an increased mutual conductance and improved high speed characteristic compared with those of the conventional IGFET.

To the accomplishment of the above and to such further objects as may hereinafter appear, the present invention relates to an insulated gate type field effect semiconductor device having narrow channel and method of fabricating same substantially as defined in the appended claims and as described in the following specification taken together with the accompanying drawings in which:

FIGS. 1(A) – (C) are cross-sectional views illustrating the steps of the process for fabricating a field effect semiconductor device according to one embodiment of this invention;

Figure 1A:
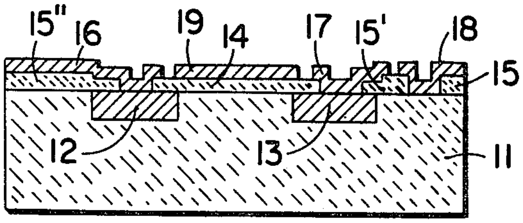
FIG. 1(D) is a perspective view of the device being fabricated by the process of FIG. 1(C)
Figure 1B:
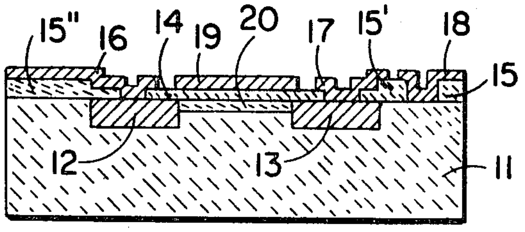

FIGS. 1(A) – 1(D) illustrate an embodiment of the semiconductor device of this invention. As shown in the drawings, a source region 12 and a drain region 13 of P-type conductivity are formed in parallel within an N-type silicon single crystal substrate having a resistivity of approximately 1.0 ohm-cm by the use of the well-known selective diffusion method. A single crystal substrate 11 is then placed on a susceptor heated to 850° C by induction-heating within a vapor growth apparatus. A mixed gas consisting of 0.5 molecular percent of aluminum chloride, 1.5 molecular percent of carbonic acid gas, and 98 molecular percent of hydrogen is then conducted into the apparatus, where an alumina film of approximately 1,800A.thick is formed on single crystal substrate 11. Furthermore, a silicon dioxide film is vapor-grown over the film of alumina by the pyrolysis of mono-silane ($SiH_4$).

The film of silicon dioxide is selectively etched and is employed as a mask for etching the underlying alumina film. The film of alumina is then treated with hot phosphoric acid for chemical etching using the film of silicon dioxide overcoating the alumina film as a mask so that an alumina gate film 14 is formed on the surface between the drain and source regions.

The surface of single crystal substrate 11 other than that of the gate region is coated with films of silicon dioxide 15, 15' and 15'' formed by thermal oxidation of the crystal substrate or by vapor growth. Alumina evaporation film is thereafter deposited and etched into electrodes 16, 17 and 18 and is ohmically contacted on source region 12, drain region 13 and silicon single crystal substrate 11, respectively, and a gate electrode 19 is attached on gate film 14 so that an IGFET is obtained. This IGFET has a critical gate voltage of +40 volts and –25 volts to shift the capacitance-voltage characteristic. An alternating current having an effective value of 60 volts at 50 cycles and exceeding the critical value of the IGFET of this embodiment, is applied across gate electrode 19 and silicon single crystal substrate 11 for 1 minute so as to sufficiently capture the electrons in alumina gate film 14 at the permanent trapping center. This trapping effect forms a highly conductive inversion layer 20 (FIG. 1B) of P-channel type with positive holes of $9 \times 10^{12}$ charge/cm$^2$ over the surface of silicon single crystal substrate 11 because of the stored negative charge of the alumina film trapping the electrons in a state where they are short-circuited through P-type conduction region 20 of this inversion layer.

Figure 1C:
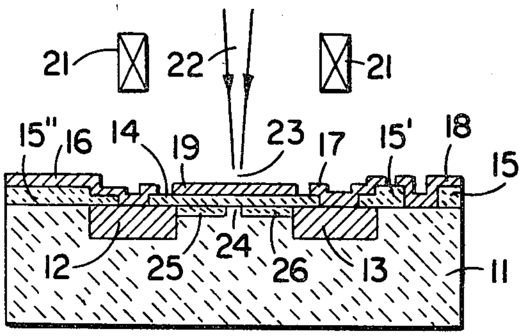

The IGFET in its short-circuit state is then treated as illustrated in FIGS. 1(C) and (D) in which an electron beam 22 derived from a suitable irradiation machine is focused into a beam having a diameter in the order of 1 micron by electron beam focusing coil 21 and is irradiated onto gate electrode 19 so as to cut the conduction region 20.

The electrons trapped in alumina film 14 just below the irradiated region 23 are excited by the rays of electrons or the secondary X-ray irradiation due to the irradiation of the rays of electrons so that the negative charge in alumina film 14 is extinguished. As a result, the conduction region 20 near the surface of the substrate just below region 23 substantially reduces the density of its positive holes, or a band-like surface region 24 (FIG. 1(C)) is formed to divide conduction region 20 into two P-type induced conduction regions 25 and 26 extending between the P-type source and drain regions 12 and 13 respectively.

Figure 1D:
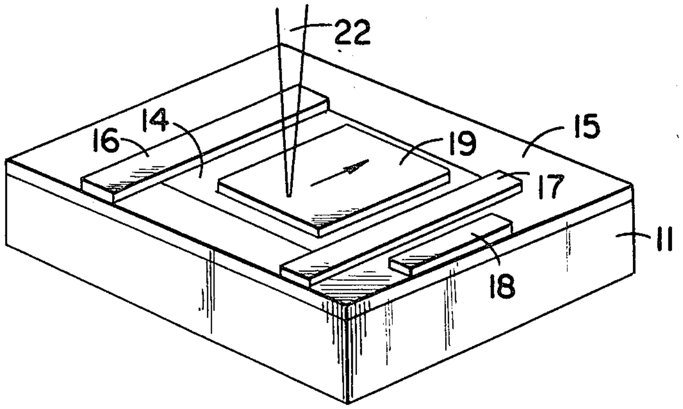

FIG. 1(D) is a perspective view illustrating a portion of the semiconductor device formed by this invention when gate electrode 19 is being irradiated by electron beam 22. Electron beam 22 is swept across gate film region 14 and gate electrode 19 in the direction of the arrow in FIG. 1 (D).

The surface charge of the MIS structure employing alumina as an insulator and having no trapped electrons is negative and corresponds to a charge of $10^{11}$ – $10^{12}$ charge/cm$^2$. Region 24 acts as the channel region of the IGFET operating in an enhancement mode as a result of its charge.

The IGFET fabricated by the process described above has a channel length (corresponding to the length between conduction regions 25 and 26) that is one-fifth to one-tenth narrower than that of a conventional field effect transistor and, because of the insulator film made of alumina with a dielectric constant of approximately 8 which is three times as large as that of a corresponding oxidation film, it provides a mutual conductance 15 to 30 times as large as that of the conventional field effect transistor together with its improved high speed performance.

Figure 2:
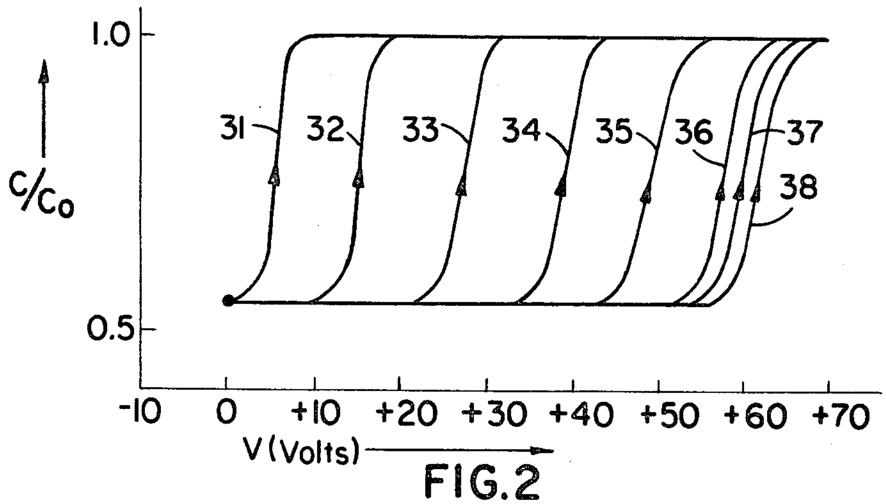
FIGS. 2 and 3 are graphs showing the capacitance vs. voltage characteristics of the semiconductor device for explaining the principle of this invention.

FIG. 2 graphically illustrates the capacitance-voltage curves for explaining the principle of the MIS structure having the alumina film employed as in the above described embodiment of this invention. As seen from the drawing, the characteristic curves are transferred in the positive direction by the application of AC voltage to the gate electrode when the electric field exceeds a critical value.

These characteristic curves are obtained when an AC voltage having a frequency of 50 cycles is applied to the MIS structure having an alumina film formed of an N-type silicon single crystal substrate of a resistivity of 1 ohm-cm. These curves 31, 32, 33, 34, 35, 36, 37 and 38 respectively represent the capacitance-voltage characteristics of an MIS structure to which alternating currents having effective values of 0, 15, 20, 40, 60, 70, 80, 90 and 100 volts are applied for a period of 1 minute. The critical value of the AC electric field at which the capacitance-voltage characteristic is caused to initially shift is at least $9 \times 10^5$ volts/cm corresponding to a minimum AC voltage applied across the gate electrode and the substrates of about 15 volts.

Figure 3:
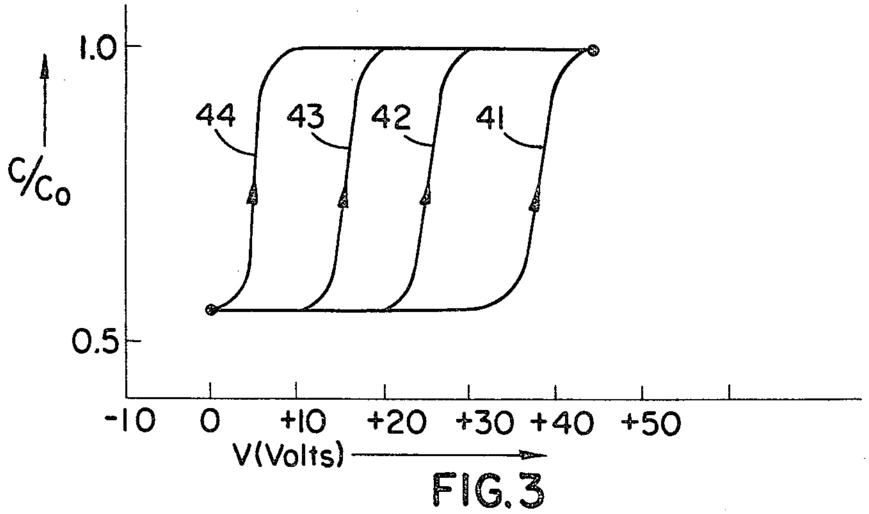

FIG. 3 illustrates the capacitance-voltage characteristics 41, 42, 43 and 44 obtained when an AC voltage of 60 V is applied for 1 minute to the MIS structure having the alumina insulating film employed in the first embodiment of the semiconductor device of this invention followed by the application of an electron beam of 40 KeV for 0, 5, 10 and 20 minutes respectively. In these characteristic curves, curve 44 is obtained after irradiation of an electron beam lasting for 20 minutes and is comparable to the initial characteristic curve 31 shown in FIG. 2. In other words, the irradiation of the semiconductor structure by the electron beam excites the electrons trapped in the permanent trapping center by the application of the AC voltage exceeding the threshold or critical level, thereby to restore the semiconductor device to its original characteristic.

Figure 4:
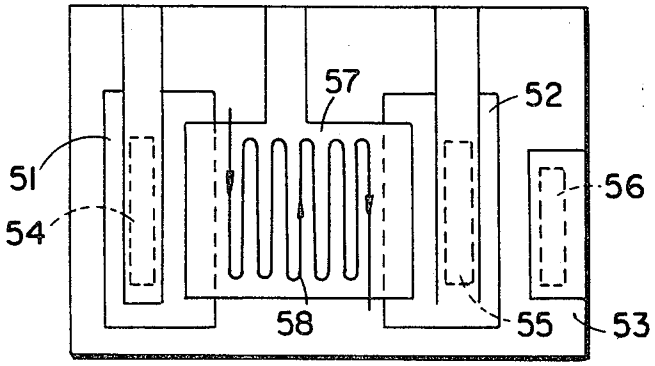
FIG. 4 is a plan view of a field effect semiconductor device according to another embodiment of this invention.

FIG. 4 is a top plan view of an IGFET according to a embodiment of this invention. This IGFET device comprises a source diffusion region 51 and a drain diffusion region 52 remarkably separately formed within a silicon single crystal substrate in comparison with those of a conventional IGFET. Openings 54, 55 and 56 are provided on insulating film 53 for respectively leading out the electrodes in ohmic contact with the source region 51, drain region 52 and the substrate, and a gate electrode 57 is formed on the alumina gate insulator film as in the first embodiment of this invention. The gate film and gate electrode 57 extend over the edge of the PN junction formed between the P-type substrate and the N-type regions 51 and 52. At the surface portion of the substrate between the drain and source regions 51 and 52 and beneath the gate electrode 57, the highly conductive inversion layer is induced in the same manner as described in the first embodiment. The channel region of this embodiment is obtained by sweeping an electron beam having a diameter of 1$\mu$ within the surface area of gate electrode 57 along a zig-zag line 58 in the direction of an arrow in FIG. 4. The ends of zig-zag line 58 extend beyond both sides of gate electrode 57 and the electron beam scanning onto gate electrode 57 is performed without damage to the gate electrode and the gate film. As a result, the positive hole density on the surface in the silicon substrate located just below the scanning portion is reduced, the electrons trapped at the permanent trapping center in the alumina film at the same portion escape therefrom, and the inversion layer is divided into two parts by the electron beam scanning. Furthermore, two induced conduction regions storing the positive holes at a high density are formed on the surface of the silicon substrate located just below the gate electrode 57. Each of these conduction regions electrically connects the drain and source regions and maintains almost the same potential as those of the source and drain voltages respectively.

The internal resistance of the IGFET of this embodiment is remarkably low because the channel region has a very short channel length and a long width corresponding to the total length of the zig-zag line. Actually, the channel region for inducing a channel in operation has an extremely broad width of about 2 mm and an extremely short length of approximately 1.5 $\mu$ between the two conduction regions within the small area under the gate electrode of $50 \times 400$ $\mu$. Moreover, the mutual conductance is greatly increased by several times to several tens of times and the delay time of signal propagation is decreased as compared to a conventional field effect transistor. These significant improvement of the characteristics of the field effect transistor of the invention results solely from the technique of the present invention, by means of which it is possible to excite the electrons trapped in the permanent trapping center by the irradiation of an electron beam, and such results can never be realized by conventional fabrication techniques.

The above example of the embodiment of this invention, is one in which the electrons trapped at the permanent trapping center are excited by the electron beam irradiated down to the gate electrode. In this example, however, the greater part of electron ray energy is dissipated by the electrode metal. This suggests that the efficiency of exiting the electrons trapped at the permanent trapping center is low so that the semiconductor device described as the second embodiment of this invention is not very advantageous although it may be easily handled during its manufacture.

The above embodiment may be modified in a manner such that an electron beam is swept along the part at which the gate electrode is selectively removed by photolithographic and etching techniques after having the transistor trap the electrons at the permanent trapping center. If a semiconductor device is manufactured in accord with the method described above, it then becomes possible to excite the trapped electrons more efficiently as compared with the semiconductor device described with respect to the second embodiment of the invention.

If the above method is used, it becomes possible to effectively excite the electrons by high energy irradiation other than electron rays, for instance, X-rays and ultraviolet rays. Thus, it follows that either irradiation of ultraviolet rays along a minute pattern image shown by curve 58 to the insulating film in the gate region, or a sweep of a small light spot can provide the same effect as obtained by an electron beam irradiation.

If a thin silicon dioxide layer is formed between the semiconductor and the alumina film as the gate insulator film, the P-channel field effect transistor may be operated in an enhancement mode and also may temporarily decrease the effect of the temporary trapping center, which discharges the electrons trapped by the inverse field, so that the permanent effect promised by the permanent trapping center is increased, thereby providing further high reliability.

If a transparent conductor film such as "Nesa" film is used as the gate electrode, it then becomes easy to fabricate the semiconductor device and further allows the irradiation of the ultraviolet rays to the gate electrode at a high efficiency.

In the particular embodiment of this invention herein disclosed, descriptions are made of a semiconductor device employing alumina as the insulating material having a permanent trapping center. But, it has recently been learned that the oxides of metals such as titanium, tungsten, tantalum and molybdenum are also provided with a more or less permanent trapping center and, therefore, are also capable of similarly trapping the electrons at their permanent trapping centers provided that they are used as the gate insulator film of an IGFET in an electric field exceeding a critical value.

Accordingly, these metal oxides can be used as the gate film substituted for the aluminum oxide employed in the semiconductor device explained as embodiments of this invention. Although in the disclosed semiconductor device silicon is used as the semiconductor material, this may be replaced by germanium or other compound semiconductors.

The semiconductor device has been disclosed herein as a P-channel insulated gate type field effect transistor. This invention is also applicable to an N-channel insulated gate type field effect transistor to yield similar effects as described above by changing the sweep region, or by sweeping the high-energy rays over that portion of the gate electrode which is other than the grooved portion converted into the channel. This invention is also capable of yielding the same effect mentioned above in an insulated gate type field effect integrated circuit, not to speak of an insulated gate type field effect transistor.

The technical scope of this invention is not restricted by the semiconductor devices described above as an embodiment of this invention and, thus while only several embodiments of this invention have been herein specifically disclosed it will be apparent that many modifications may be made therein all without departing from the spirit and scope of the invention.

We claim:

1. An insulated gate type field effect semiconductor device having a semiconductor substrate, source and drain regions formed in said substrate, an insulator film formed on said substrate, and a conductor gate electrode formed on said insulator film, said insulator film being effective when a predetermined potential is applied across both surfaces of said insulator film below said gate electrode to form an insulating material region in operative contact with said source and drain regions where electrons are trapped at a trapping center and another insulating material region where less electrons are trapped, said latter region defining an operative channel intermediate said source and drain regions.

2. The semiconductor device of claim 1, in which said insulator film is formed of aluminum oxide.

3. The semiconductor device of claim 2, in which said insulator film extends between said source and drain regions.

4. A method of fabricating an insulated gate field effect semiconductor device having an operative channel of effectively reduced length, said method comprising the steps of providing an insulated gate field effect semiconductor substrate, forming source and drain regions spaced from one another in said substrate, forming an insulator gate film on the surface of said substrate between said source and drain regions, forming a conductor gate electrode on said insulator gate film, said insulator film being capable of storing electrons in trapping centers therein in response to an applied voltage not lower than a critical value across said insulator gate film, applying a voltage exceeding said critical value to said insulator gate electrode to thereby trap electrons in said trapping centers within said insulator gate film and form an inversion conducting layer beneath said insulator gate film extending between said source and drain regions, and thereafter irradiating a portion of said insulator gate film at a location on said gate film intermediate said source and drain regions with a narrow, high-energy beam of a width less than the distance between said source and drain regions to thereby partially excite the electrons trapped in said trapping centers in said thus irradiated portion of said insulator gate film to establish a region in said insulator gate film in which a reduced number of electrons are trapped and thereby establish an effective channel in said inversion layer and underlying said insulator gate film region, said channel having a width less than the distance between said source and drain regions.

5. The method of claim 4, in which said insulating gate material is aluminum oxide.

6. The method of claim 4, in which said irradiating step comprises the step of irradiating the surface of said conductor gate with a narrow electron beam of said high-energy rays.

7. The method of claim 6, in which said irradiating step comprises the steps of producing an electron beam, and focusing said electron beam to define said narrow beam.

8. The method of claim 6, in which said beam is a light beam.

9. the method of claim 6, in which said beam is an X-ray beam.

10. The method of claim 6, in which said irradiating step comprises the step of moving said narrow beam along a zig-zag path over said electrode.

11. The method of fabricating an insulated gate field semi-conductor device of claim 4, in which said high-energy beam is swept across the surface of said gate electrode.

* * * * *